(12) United States Patent
Lee et al.

(10) Patent No.: US 9,297,074 B2
(45) Date of Patent: Mar. 29, 2016

(54) LIQUID CRYSTAL DISPLAY PANEL REPAIRING METHOD AND REPAIRING SYSTEM

(71) Applicant: Shenzhen China Star Optoelectronics Technology Co., Ltd., Shenzhen, Guangdong (CN)

(72) Inventors: Kuancheng Lee, Guangdong (CN); Ji Li, Guangdong (CN); Yahui Chen, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 92 days.

(21) Appl. No.: 14/345,896

(22) PCT Filed: Jan. 13, 2014

(86) PCT No.: PCT/CN2014/070548
§ 371 (c)(1),
(2) Date: Mar. 19, 2014

(87) PCT Pub. No.: WO2015/100796
PCT Pub. Date: Jul. 9, 2015

(65) Prior Publication Data
US 2015/0184299 A1    Jul. 2, 2015

(30) Foreign Application Priority Data

Dec. 31, 2013  (CN) .......................... 2013 1 0753941

(51) Int. Cl.
*C23C 16/48*  (2006.01)
*C23C 16/00*  (2006.01)
(Continued)

(52) U.S. Cl.
CPC ............. *C23C 16/483* (2013.01); *C23C 16/047* (2013.01); *C23C 16/26* (2013.01)

(58) Field of Classification Search
CPC . G06F 1/136259; C23C 16/483; C23C 16/26; C23C 16/047
USPC .............................................. 427/582, 249.1
See application file for complete search history.

(56) References Cited

U.S. PATENT DOCUMENTS

| | | | | |
|---|---|---|---|---|
| 2007/0046849 A1* | 3/2007 | Lai | .................... | G02F 1/136259 349/54 |
| 2013/0160608 A1* | 6/2013 | Nusko | .................. | B22F 1/0025 75/370 |
| 2015/0033557 A1* | 2/2015 | Kotler | .................... | H05K 3/027 29/847 |

FOREIGN PATENT DOCUMENTS

| | | |
|---|---|---|
| CN | 101017256 A | 8/2007 |
| CN | 101441373 A | 5/2009 |

(Continued)

OTHER PUBLICATIONS

Kim et al. Copper-Vapor-Assisted Chemical Vapor Deposition for High-Quality and Metal-Free Single-Layer Graphene on Amorphous SiO2 Substrate, ACS Nano, 2013, vol. 7, No. 8, pp. 6575-6582.*

(Continued)

*Primary Examiner* — Kelly M Gambetta
(74) *Attorney, Agent, or Firm* — Andrew C. Cheng

(57) ABSTRACT

The present invention provides a liquid crystal display panel repairing method and repairing system. The method includes: (1) providing a liquid crystal display panel, in which the liquid crystal display panel has a circuit that has a breaking site; and (2) applying laser chemical vapor deposition to form graphene on the liquid crystal display panel in such a way as to joint the breaking site. The liquid crystal display panel repairing method and repairing system of the present invention use laser chemical vapor deposition to form graphene on a breaking site to repair the breaking site. The process is simple and the result of repairing is good. Further, a common gas, such as methane, is used as a carbon source gas, making it favorable for environmental protection. Further, the number of layers of graphene so formed can be controlled by controlling whether to apply irradiation of the laser so as to achieve control of electrical conductivity of the graphene so formed and enhance the result of repairing. Further, the light spot of laser can be adjusted in regard to the radius thereof in order to control the resolution of graphene grown line and the optic path of the laser can be adjusted to allow the light spot to follow a predetermined path to heat selected areas of the substrate to deposit a desired graphene line or shape.

12 Claims, 4 Drawing Sheets

1 — providing a liquid crystal display panel, wherein the liquid crystal display panel comprises a circuit that has a breaking site 2 — applying laser chemical vapor deposition to form graphene on the liquid crystal display panel in such a way as to joint the breaking site

(51) Int. Cl.
*C23C 16/26* (2006.01)
*C23C 16/04* (2006.01)

(56) References Cited

FOREIGN PATENT DOCUMENTS

| CN | 102540508 A | 7/2012 |
| CN | 102629035 A | 8/2012 |
| CN | 102645802 A | 8/2012 |
| CN | 103257464 A | 8/2013 |
| CN | 103311220 A | 9/2013 |

OTHER PUBLICATIONS

Park et al. Transparent interconnections formed by rapid single-step fabrication of graphene patterns, App Phys Lett, 2011, 99 pp. 053103 (3 pages).*

* cited by examiner

LIQUID CRYSTAL DISPLAY PANEL REPAIRING METHOD AND REPAIRING SYSTEM

BACKGROUND OF THE INVENTION

1. Field of the Invention

The present invention relates to the field of flat panel displaying, and in particular to a liquid crystal display panel repairing method and repairing system.

2. The Related Arts

A thin-film transistor (TFT) is a key structure of an active matrix liquid crystal display (TFT-LCD) and thus, whether the TFT matrix is good or not is vital to the quality of the TFT-LCD. However, the array process that is used to form the TFT structure is complicated and sophisticated. During the cyclic operations of the process, defects of the TFT are often generated, such as defects of electrode shorting or electrode breaking for channels, source terminals, drain terminals, and gate terminals or defects of shorting or breaking associated with wiring for scan lines and signal lines, and defects of storage capacitor electrodes and pixel electrodes. Thus, to cope with these defects, a typical array process involves a laser CVD (Chemical Vapor Deposition) repairing step after the process of forming gate terminals and source/drain terminals. With the progress of the TFT-LCD in a direction toward high resolution and high fineness, to ensure a TFT is manufactured to be completely defect free is generally not realistic. Thus, repair of TFT, particularly fine repair of TFT, becomes very important.

Laser CVD is a technique that uses laser chemical reaction to directly deposit a micro-film, in which laser is used to heat or to directly act on gas molecules to break the gas molecules for being then deposited on a substrate to form a film. Laser CVD has the following advantages: (1) micro area deposition, high spatial resolution, and being controllable, area not irradiated by laser being not subjected to thermal influence; (2) being capable of realizing efficient temperature rise in a specific area to reach the decomposition temperature of the chemical substance attached to the undersurface of the substrate and fast deposition; (3) being free of pollution and contamination and operation being easy; and (4) being capable of use in combination with other laser processing techniques. Based on such advantages, laser CVD demonstrates a value of important application to repairing line breaking or surface breaking of a TFT array. Heretofore, the laser CVD repairing method that is used in TFT wiring generally uses chromium hexacarbonyl ($Cr(CO)_6$) or tungsten hexacarbonyl ($W(CO)_6$) as a reactant gas to allow for deposition of a metal line of chromium (Cr) or tungsten (W) to re-joint the circuit. However, such a repaired portion has inconsistent conductivity, which will leads to thermal stress when subjected to application of heat load and consequently leading to a potential problem of reliability of the repaired spot. Further, the substance used, $Cr(CO)_6$ and $W(CO)_6$, is a substance that is extremely toxicant and is harmful to the environment.

Graphene is a new type of nano-carbon material demonstrating supper conductivity of electricity and heat and mechanical property. Thus, if graphene is used to replace Cr or W for deposition on a breaking defect, then due to the excellent capability of graphene for transmission of electrical charges and thermal energy and excellent extensibility, the reliability of the repaired spot can be enhanced. Heretofore, the methods that are used to grow graphene include mechanical exfoliation, silicon carbide (SiC) epitaxial growth, oxidation and reduction, and chemical vapor deposition, among which CVD is the most commonly used method with which graphene can grow with less defects and better quality. On the other hand, growing graphene with CVD process uses a material that is readily commonly available hydrocarbons, which is more secure and safer that the material used to deposit W or Cr and also has a lower cost. The process for manufacturing graphene with CVD is to have a carbon-contained gas, such as hydrocarbons, cracked under a high temperature into carbon atoms deposited on an undersurface of a substrate to form graphene. The heating method that is commonly adopted to generate the high temperature is heating with a resistance wire. However, this manner has a low rate of rising or lowering temperature and may set the entire substrate in the high temperature, making it not possible to realize selective deposition in micro areas. Using this method to repair the defects of a TFT-LCD may cause damages to various structures.

SUMMARY OF THE INVENTION

An object of the present invention is to provide a liquid crystal display panel repairing method, which applies laser chemical vapor deposition to form graphene at a circuit-breaking site in order to repair the breaking and of which the process is simple, the result of repairing is good, and a carbon source gas is selected from common gases, such as methane, which are favorable for environmental protection.

Another object of the present invention is to provide a liquid crystal display panel repairing system, which comprises a control system for controlling activation/deactivation of laser facility so as to effectively control the number of layers of graphene so formed thereby controlling the electrical conductivity of graphene to enhance the result of repairing.

To achieve the objects, the present invention provides a liquid crystal display panel repairing method, which comprises the following steps:

(1) providing a liquid crystal display panel, wherein the liquid crystal display panel comprises a circuit that has a breaking site; and (2) applying laser chemical vapor deposition to form graphene on the liquid crystal display panel in such a way as to joint the breaking site.

The liquid crystal display panel comprises a substrate, a data line and a scan line formed on the substrate, an insulation layer formed on the data line and the scan line, and a pixel electrode formed on the insulation layer. The breaking site is located on one of the data line, the scan line, and the pixel electrode.

The graphene is formed on the breaking site of the data line, the scan line, or the pixel electrode in order to electrically connect the data line, the scan line, or the pixel electrode.

The graphene is formed on the insulation layer and access holes are formed in the insulation layer to allow the graphene to extend through the access holes to electrically connect the data line or the scan line.

In step (2), a mixed gas of methane and hydrogen, methane and argon, or ethane and hydrogen or argon is used as the carbon source gas and a laser is used as an energy source to carry out the laser chemical vapor deposition.

In step (2), copper vapor is used as a catalyst to carry out the laser chemical vapor deposition.

The liquid crystal display panel repairing method further comprises a step (3), in which the graphene is exposed to an environment of dopant molecules to proceed with molecular doping of the graphene.

The present invention also provides a liquid crystal display panel repairing method, which comprises the following steps:

(1) providing a liquid crystal display panel, wherein the liquid crystal display panel comprises a circuit that has a breaking site; and (2) applying laser chemical vapor deposition to form graphene on the liquid crystal display panel in such a way as to joint the breaking site;

wherein the liquid crystal display panel comprises a substrate, a data line and a scan line formed on the substrate, an insulation layer formed on the data line and the scan line, and a pixel electrode formed on the insulation layer, the breaking site being located on one of the data line, the scan line, and the pixel electrode; and wherein in step (2), a mixed gas of methane and hydrogen, methane and argon, or ethane and hydrogen or argon is used as the carbon source gas and a laser is used as an energy source to carry out the laser chemical vapor deposition.

The graphene is formed on the breaking site of the data line, the scan line, or the pixel electrode in order to electrically connect the data line, the scan line, or the pixel electrode.

The graphene is formed on the insulation layer and access holes are formed in the insulation layer to allow the graphene to extend through the access holes to electrically connect the data line or the scan line.

In step (2), copper vapor is used as a catalyst to carry out the laser chemical vapor deposition.

The liquid crystal display panel repairing method further comprises a step (3), in which the graphene is exposed to an environment of dopant molecules to proceed with molecular doping of the graphene.

The present invention further provides a liquid crystal display panel repairing system, which comprises: a working platform, a gas chamber arranged on the working platform, a gas processing system in communication with the gas chamber, an exhaust system in communication with the gas chamber, a laser device arranged above the gas chamber, and a control system electrically connected to the gas processing system and the laser device, wherein the laser device comprises a laser unit, a switch, and an acousto-optic scanner; the gas processing system supplies a carbon source gas; the exhaust system discharges exhaust gas; the laser device supplies a laser beam; and the control system controls the gas processing system and the laser device.

The liquid crystal display panel repairing system further comprises a display device electrically connected to the acousto-optic scanner.

The control system controls actuation and de-actuation of the switch to control the laser unit to supply or shut off the laser beam.

The efficacy of the present invention is that the present invention provides a liquid crystal display panel repairing method and repairing system, which employs laser chemical vapor deposition to form graphene on a breaking site to repair the breaking site. The process is simple and the result of repairing is good. Further, a common gas, such as methane, is used as a carbon source gas, making it favorable for environmental protection. Further, the number of layers of graphene so formed can be controlled by controlling whether to apply irradiation of the laser so as to achieve control of electrical conductivity of the graphene so formed and enhance the result of repairing. Further, the light spot of laser can be adjusted in regard to the radius thereof in order to control the resolution of graphene grown line and the optic path of the laser can be adjusted to allow the light spot to follow a predetermined path to heat selected areas of the substrate to deposit a desired graphene line or shape, whereby repairing can be performed efficiently and accurately.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
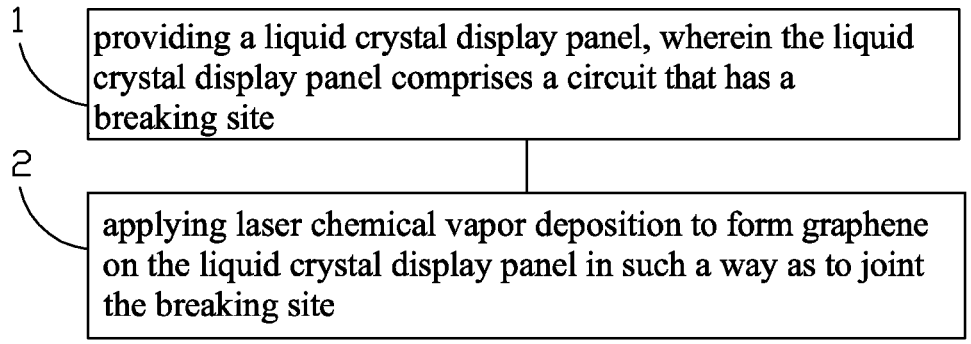
FIG. 1 is a flow chart illustrating a liquid crystal display panel repairing method according to the present invention.

Referring to FIG. 1, the present invention provides a liquid crystal display panel repairing method, which comprises the following steps:

Step 1: providing a liquid crystal display panel, wherein the liquid crystal display panel comprises a circuit that has a breaking site.

Step 2: applying laser chemical vapor deposition to form graphene on the liquid crystal display panel in such a way as to joint the breaking site.

The present invention uses graphene to replace the conventionally used chromium or tungsten for deposition on the breaking site to repair the defect. Since graphene has better capable of transmission of electrical charges and heat and excellent extendibility, it can overcome the problem of failure of repairing made with chromium or tungsten resulting from thermal stress and enhance the reliability of the repaired spot. Further, the substance that is adopted in the conventional solution, such as $Cr(CO)_6$ and $W(CO)_6$, is generally a substance that is toxicant and harmful to the environment. However, the material that is adopted in the present invention to grow graphene is hydrocarbons that are easily accessible, which are safer and more environment-conservative than chromium and tungsten and have a lower cost.

Specifically, the liquid crystal display panel comprises a substrate, a data line and a scan line formed on the substrate, an insulation layer formed on the data line and the scan line, and a pixel electrode formed on the insulation layer. The breaking site may be located on the data line, the scan line, or the pixel electrode.

Figure 2:
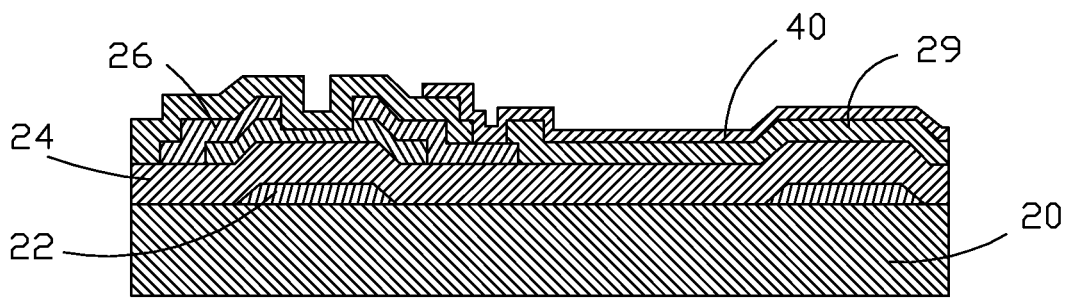
FIG. 2 is a schematic view showing the structure of a liquid crystal display panel that is subjected to repairing with the liquid crystal display panel repairing method according to the present invention.
Figure 3:
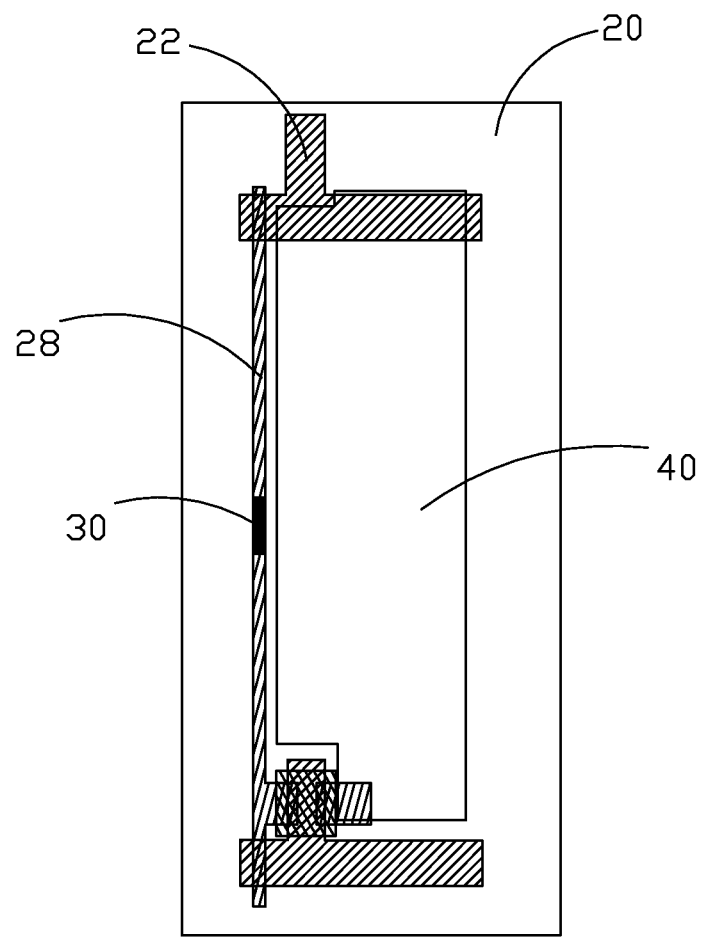
FIG. 3 is a schematic view showing the structure of a first example of the liquid crystal display panel subjected to repairing with the liquid crystal display panel repairing method according to the present invention.

Referring to FIGS. 2 and 3, a breaking site formed on the data line will be taken as an example for illustration:

In the instant example, the liquid crystal display panel comprises a substrate 20, a gate terminal 22 formed on the substrate 20, a gate insulation layer 24 formed on the gate terminal 22, source/drain terminals 26 formed on the gate insulation layer 24 and a data line 28 formed on the gate insulation layer 24, and a breaking site is located on an exposed portion of the data line 28. To carry out repairing of the breaking site, graphene 30 is formed on the gate insulation layer 24 at a location corresponding to the breaking site to connect two opposing ends of the data line 28 at the breaking site so as to make the data line 28 jointed and forming a conductive path.

A specific way for forming graphene 30 is as follows: placing the liquid crystal display panel in a hermetically enclosed environment and introducing a carbon source gas into the hermetically enclosed environment, followed by irradiation with laser to have carbon that is contained in the carbon source gas deposited on the breaking site of the data line 28 of the liquid crystal display panel to form graphene 30.

Specifically, the carbon source gas can be a mixed gas of methane ($CH_4$) and hydrogen ($H_2$); methane and argon (Ar); or ethane ($C_2H_6$) and hydrogen or argon. Irradiation with laser causes the temperature of the breaking site to reach a range between 650-1200° C., preferably 1000° C.

The present invention employs laser chemical vapor deposition to grow graphene at the location of the breaking site so as to realize direct heating to the growth area only without inducing any additional heated area and thus avoiding thermal influence on other areas. Further, it is possible to have the growth area quickly reach a desired temperature by simply varying the energy of the laser, and it is also possible to fast remove the laser beam by simply shutting down the laser unit so as to show a characteristic of fast temperature lowering to avoid necessary growth of multiple layers of graphene and allows for effective control of the number of layer of graphene so grown. Further, the light spot of laser can be adjusted in regard to the radius thereof in order to control the resolution of graphene grown line and the optic path of the laser can be adjusted to allow the light spot to follow a predetermined path to heat selected areas of the substrate to deposit a desired graphene line or shape.

Further, the present invention can use copper vapor as a catalyst in depositing graphene 30 in order to get better deposition of graphene 30 and to ensure the result of repairing of the liquid crystal display panel.

It is noted that the present invention may further comprises Step 3, wherein after the formation of graphene 30, exposing graphene 30 in an environment of dopant molecules to carry out molecular doping on graphene 30 in order to improve the electrical conduction property of graphene 30 and thus enhance the result of repairing.

Further, the dopant molecules can be introduced, together with the carbon source gas, into the hermetically enclosed environment so that molecular doping can proceed at the same time when graphene 30 is being formed in order to simplify the repairing process and improve the repairing efficiency.

Figure 4:
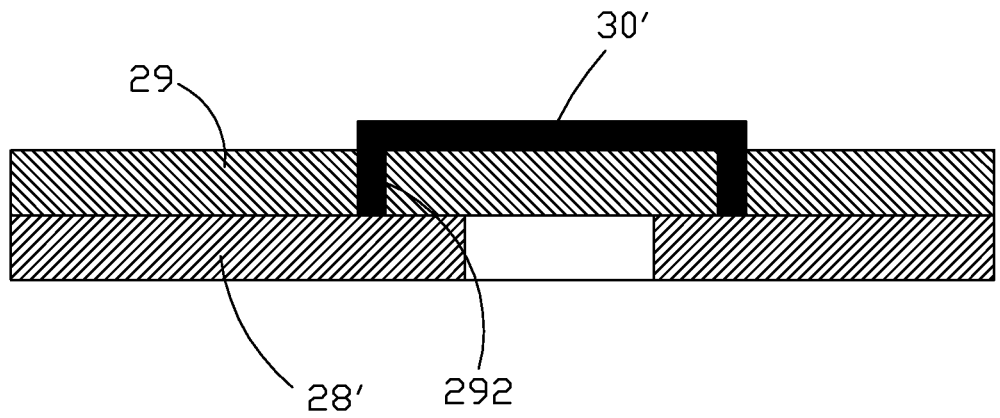
FIG. 4 is a schematic view showing the structure of a second example of the liquid crystal display panel subjected to repairing with the liquid crystal display panel repairing method according to the present invention.

Referring to FIGS. 2 and 4, a second example of the liquid crystal display panel repairing method of the present invention is illustrated. In the instant embodiment, the breaking site of the data line 28' is located under a protective layer 29. To repair, access holes 292 must be first formed in the protective layer 29 to expose the opposing ends of the breaking site of the data line 28', and then graphene 30' is formed on the protective layer 29 to allow graphene 30' to extend through the access holes 292 to electrically connect the data line 28' at the breaking site for realizing repairing. In the instant embodiment, the way that is employed to form graphene 30' is identical to that used to form graphene 30 in the previously described first example and repeated description is omitted here.

Figure 5:
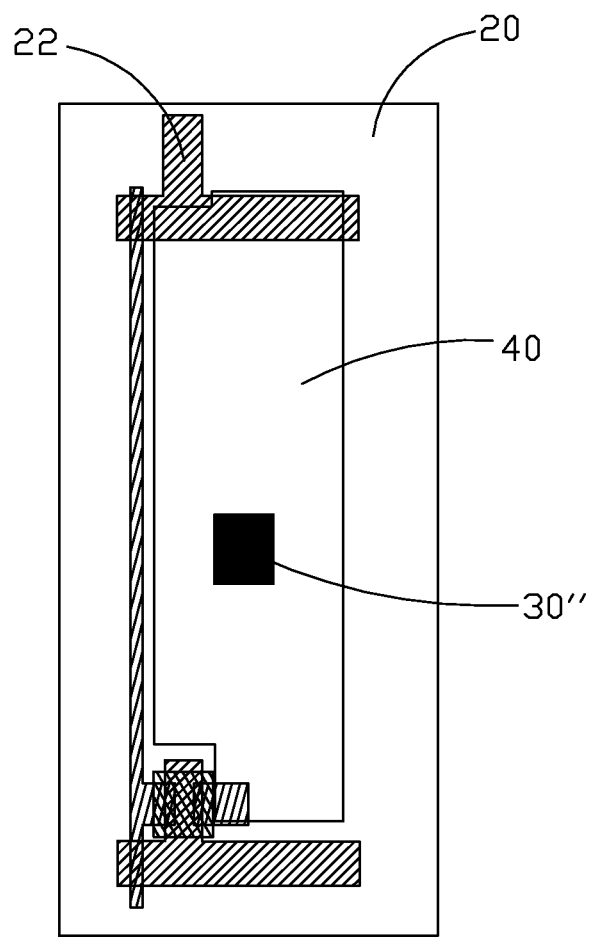
FIG. 5 is a schematic view showing the structure of a third example of the liquid crystal display panel subjected to repairing with the liquid crystal display panel repairing method according to the present invention.

Referring to FIGS. 2 and 5, a third example of the liquid crystal display panel repairing method of the present invention is illustrated. In the instant embodiment, a breaking site is located on the pixel electrode 40. The pixel electrode 40 is located above the protective layer 29. To repair, graphene 30" is formed on the protective layer 29 to completely fill in the defect of the breaking site of the pixel electrode 40 so as to realize repairing. In the instant embodiment, the way that is employed to form graphene 30" is identical to that used to form graphene 30 in the previously described first example and repeated description is omitted here.

Figure 6:
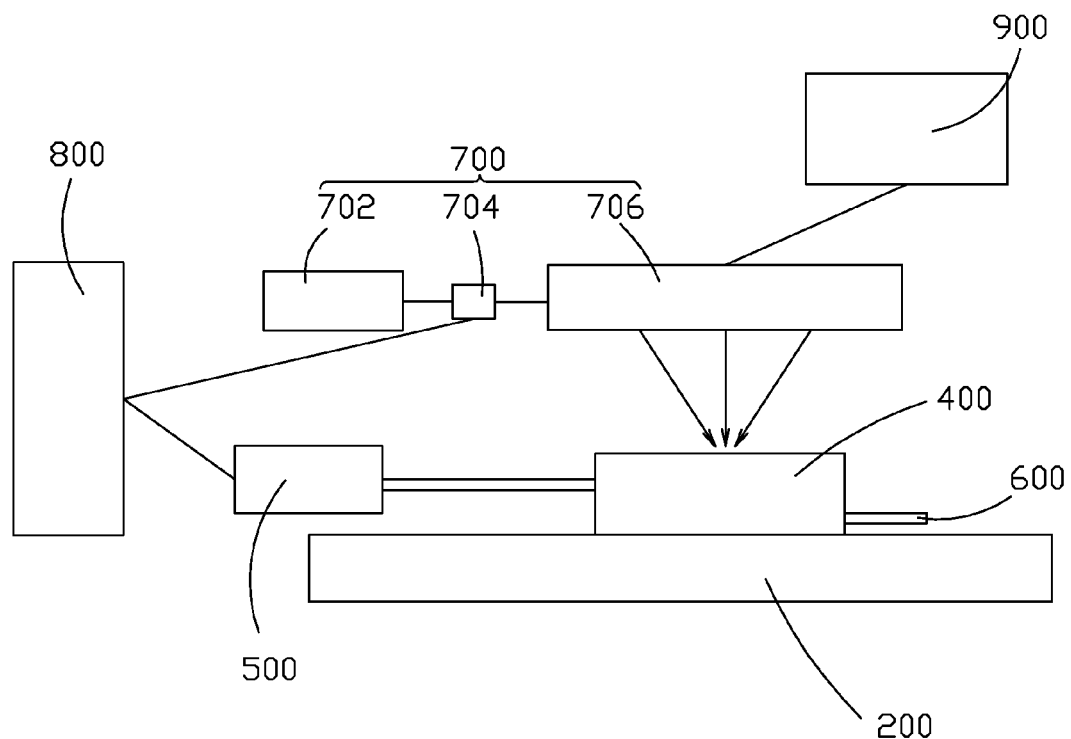
FIG. 6 is a schematic view showing a configuration of a liquid crystal display panel repairing system according to the present invention.

Referring to FIG. 6, the present invention further provides a liquid crystal display panel repairing system, which comprises: a working platform 200, a gas chamber 400 arranged on the working platform 200, a gas processing system 500 in communication with the gas chamber 400, an exhaust system 600 in communication with the gas chamber 400, a laser device 700 arranged above the gas chamber 400, and a control system 800 electrically connected to the gas processing system 500 and the laser device 700. The laser device 700 comprises a laser unit 702, a switch 704, and an acousto-optic scanner 706. The gas processing system 500 supplies a carbon source gas. The exhaust system 600 discharges exhaust gas. The laser device 700 supplies a laser beam. The control system 800 controls the gas processing system 500 and the laser device 700.

The mode of operation is as follows. A liquid crystal display panel to be repaired is placed in the gas chamber 400. The control system 800 controls the gas processing system 500 to supply the carbon source gas into the gas chamber 400 and the control system 800 sets the switch 704 on to enable the laser unit 702 to emit the laser beam to irradiate into the gas chamber 400 and also controls the acousto-optic scanner 706 to control the irradiation path of the laser beam to enable graphene to be formed on the breaking site of the liquid crystal display panel and thus realizing repairing of the liquid crystal display panel.

It is noted that the liquid crystal display panel repairing system may further comprises a display device 900 that is electrically connected to the acousto-optic scanner 706 for observation the formation of graphene on the liquid crystal display panel.

In summary, the present invention provides a liquid crystal display panel repairing method and repairing system, which employs laser chemical vapor deposition to form graphene on a breaking site to repair the breaking site. The process is simple and the result of repairing is good. Further, a common gas, such as methane, is used as a carbon source gas, making it favorable for environmental protection. Further, the number of layers of graphene so formed can be controlled by controlling whether to apply irradiation of the laser so as to achieve control of electrical conductivity of the graphene so formed and enhance the result of repairing. Further, the light spot of laser can be adjusted in regard to the radius thereof in order to control the resolution of graphene grown line and the optic path of the laser can be adjusted to allow the light spot to follow a predetermined path to heat selected areas of the substrate to deposit a desired graphene line or shape.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A liquid crystal display panel repairing method, comprising the following steps:
    (1) providing a liquid crystal display panel, wherein the liquid crystal display panel comprises a circuit that has a breaking site, where two parts of the circuit are spaced from each other; and
    (2) applying laser chemical vapor deposition to deposit carbon on the breaking site of the circuit so as to form graphene on the liquid crystal display panel as a connection to joint the two spaced parts of the circuit at the breaking site.

2. The liquid crystal display panel repairing method as claimed in claim 1, wherein the liquid crystal display panel comprises a substrate, a data line and a scan line formed on the substrate, an insulation layer formed on the data line and the scan line, and a pixel electrode formed on the insulation layer, the breaking site being located on one of the data line, the scan line, and the pixel electrode.

3. The liquid crystal display panel repairing method as claimed in claim 2, wherein the graphene is formed on the breaking site of the data line, the scan line, or the pixel electrode in order to electrically connect the data line, the scan line, or the pixel electrode.

4. The liquid crystal display panel repairing method as claimed in claim 2, wherein the graphene is formed on the insulation layer, access holes being formed in the insulation layer to allow the graphene to extend through the access holes to electrically connect the data line or the scan line.

5. The liquid crystal display panel repairing method as claimed in claim 1, wherein in step (2), a mixed gas of methane and hydrogen, methane and argon, or ethane and hydrogen or argon is used as the carbon source gas and a laser is used as an energy source to carry out the laser chemical vapor deposition.

6. The liquid crystal display panel repairing method as claimed in claim 5, wherein in step (2), copper vapor is used as a catalyst to carry out the laser chemical vapor deposition.

7. The liquid crystal display panel repairing method as claimed in claim 1 further comprising a step (3), in which the graphene is exposed to an environment of dopant molecules to proceed with molecular doping of the graphene.

8. A liquid crystal display panel repairing method, comprising the following steps:
    (1) providing a liquid crystal display panel, wherein the liquid crystal display panel comprises a circuit that has a breaking site, where two parts of the circuit are spaced from each other; and
    (2) applying laser chemical vapor deposition to deposit carbon on the breaking site of the circuit so as to form graphene on the liquid crystal display panel as a connection to joint the two spaced parts of the circuit at the breaking site;
    wherein the liquid crystal display panel comprises a substrate, a data line and a scan line formed on the substrate, an insulation layer formed on the data line and the scan line, and a pixel electrode formed on the insulation layer, the breaking site being located on one of the data line, the scan line, and the pixel electrode; and
    wherein in step (2), a mixed gas of methane and hydrogen, methane and argon, or ethane and hydrogen or argon is used as the carbon source gas and a laser is used as an energy source to carry out the laser chemical vapor deposition.

9. The liquid crystal display panel repairing method as claimed in claim 8, wherein the graphene is formed on the breaking site of the data line, the scan line, or the pixel electrode in order to electrically connect the data line, the scan line, or the pixel electrode.

10. The liquid crystal display panel repairing method as claimed in claim 8, wherein the graphene is formed on the insulation layer, access holes being formed in the insulation layer to allow the graphene to extend through the access holes to electrically connect the data line or the scan line.

11. The liquid crystal display panel repairing method as claimed in claim 8, wherein in step (2), copper vapor is used as a catalyst to carry out the laser chemical vapor deposition.

12. The liquid crystal display panel repairing method as claimed in claim 8 further comprising a step (3), in which the graphene is exposed to an environment of dopant molecules to proceed with molecular doping of the graphene.

\* \* \* \* \*